United States Patent
Chu et al.

[11] Patent Number: 6,164,076
[45] Date of Patent: Dec. 26, 2000

[54] THERMOELECTRIC COOLING ASSEMBLY WITH THERMAL SPACE TRANSFORMER INTERPOSED BETWEEN CASCADED THERMOELECTRIC STAGES FOR IMPROVED THERMAL PERFORMANCE

[75] Inventors: Richard C. Chu, Poughkeepsie; Michael J. Ellsworth, Jr., Lagrangeville; Robert E. Simons, Poughkeepsie, all of N.Y.

[73] Assignee: International Business Machines Corporation, Armonk, N.Y.

[21] Appl. No.: 09/368,803

[22] Filed: Aug. 5, 1999

[51] Int. Cl.[7] ........................................... F25B 21/02
[52] U.S. Cl. ............................... 62/3.7; 62/259.2
[58] Field of Search ................... 62/259.2, 3.7, 62/335

[56] References Cited

U.S. PATENT DOCUMENTS

| | | | |
|---|---|---|---|
| 4,812,733 | 3/1989 | Tobey | 323/285 |
| 5,456,081 | 10/1995 | Chrysler et al. | 62/3.7 |
| 5,940,784 | 8/1999 | El-Husayni | 702/130 |
| 5,966,939 | 10/1999 | Tauchi | 62/3.2 |

FOREIGN PATENT DOCUMENTS

WO 94/07094  3/1994  Germany.

OTHER PUBLICATIONS

Sara Godfrey, Melcor Corporation, "Electronics Cooling: An introduction to thermoelectric coolers", http://www.electronics-cooling.com/Resources/EC_Articles/Sep96/sep96_04.htn, (Sep. 1996), 7pp.

*Primary Examiner*—William Doerrler
*Assistant Examiner*—Melvin Jones
*Attorney, Agent, or Firm*—Lily Neff, Esq.; Heslin & Rothenberg, P.C.

[57] ABSTRACT

A thermoelectric cooling assembly is provided having at least a first thermoelectric stage thermally coupled to a heat source, such as an electronic device, and a second thermoelectric stage thermally coupled to the first thermoelectric stage across a "thermal space transformer". The first thermoelectric stage has a first surface area for thermal dissipation and the second thermoelectric stage has a second surface area for thermal absorption wherein the second surface area is greater than the first surface area. The thermal space transformer has a first thermal conductivity in a plane transverse to a direction of primary heat flow through the first thermoelectric stage and the second thermoelectric stage, and a second thermal conductivity in a direction parallel to the direction of primary heat flow, wherein the first thermal conductivity is greater than the second thermal conductivity. In one embodiment, the thermal space transformer can comprise a graphite composite material with diamond coating on both main surfaces thereof. The thermoelectric cooling assembly can further comprise: a cold plate; a refrigeration unit coupled to the cold plate; a dc power controller for controlling dc power through the first and second thermoelectric stages; and a temperature sensor for providing feedback information to the dc power controller on temperature of the electronic device being cooled.

21 Claims, 4 Drawing Sheets

DISSIPATED HEAT

THERMOELECTRIC COOLING ASSEMBLY WITH THERMAL SPACE TRANSFORMER INTERPOSED BETWEEN CASCADED THERMOELECTRIC STAGES FOR IMPROVED THERMAL PERFORMANCE

TECHNICAL FIELD

The present invention is directed to cooling assemblies and other apparatus used for removing heat from electronic devices. More particularly, the present invention is directed to an apparatus for cooling an electronic module through the utilization of thermoelectric cooling elements. Even more particularly, this invention is directed to a thermal space transformer to be interposed between a first thermoelectric stage and a second thermoelectric stage of a multi-stage cascaded thermoelectric cooling assembly.

BACKGROUND OF THE INVENTION

As is well known, as the circuit density of electronic chip devices increases, there is a correspondingly increasing demand for the removal of heat generated by these devices. The increased heat demand arises both because the circuit devices are packed more closely together and because the circuits themselves are operated at increasingly high clock frequencies. Nonetheless, it is also known that runaway thermal conditions and excessive heat generated by chips is a leading cause for failure of chip devices. Furthermore, it is anticipated that the demand for heat removal for these devices will increase indefinitely. Accordingly, it is seen that there is a large and significant need to provide useful cooling mechanisms for electronic circuit devices.

The use of thermoelectric cooling elements is known. These elements operate electronically to produce a cooling effect. By passing a direct current through the legs of a thermoelectric device, a temperature difference is produced across the device which is contrary to that which would be expected from Fourier's Law.

At one junction of the thermoelectric element both holes and electrons move away, toward the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (air or water) or provide greater heat removal capacity for a given cold plate or component temperature. When direct current is passed through these thermoelectric modules a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the module.

DISCLOSURE OF THE INVENTION

Conventional configurations of thermoelectric assemblies are nonetheless seen herein to be unnecessarily limiting in terms of the thermal energy which may be transferred. Thus, while the use of thermoelectric devices is seen to provide a means for the solid state cooling of adjacent electrical devices, their efficiency has been less than optimal.

In addition, as complementary metal oxide semiconductor (CMOS) circuit and process technologies approach scaling limits, it becomes necessary to seek approaches and opportunities to achieve further performance gains. One avenue which is receiving increased attention is the operation of CMOS circuits at lower temperatures. The circuit performance enhancements which may be achieved vary from about 1.1×at a cooling condition of 25° C., to 1.8×at a cooling condition of −200° C. To obtain cooling conditions down to about −50° C. or so, conventional refrigeration technology may be utilized. However, conventional refrigeration systems may be difficult to control for variations in heat load, and may not be responsive enough during transient operating conditions.

To summarize the present invention, therefore, provided herein in one aspect is an apparatus for cooling an electronic device. This apparatus includes a first thermoelectric stage thermally coupled to the electronic device and a second thermal electric stage. The first thermoelectric stage has a first surface area for thermal dissipation, the second thermoelectric stage has a second surface area for thermal absorption, and the second surface area is greater than the first surface area. The apparatus further includes a thermal space transformer disposed between the first thermoelectric stage and the second thermoelectric stage and thermally coupling the first and second stages together. The thermal space transformer has a first thermal conductivity in a (x-y axis) plane transverse to a direction of primary heat flow through the first thermoelectric stage and the second thermoelectric stage, and a second thermal conductivity in a (z-axis) direction parallel to the direction of primary heat flow through the first thermoelectric stage and the second thermoelectric stage. The first thermal conductivity is greater than the second thermal conductivity.

In another aspect, the present invention comprises apparatus for cooling a heat source. This apparatus includes a first thermoelectric stage thermally coupled to the heat source and a second thermoelectric stage. The first thermoelectric stage has a first surface area for thermal dissipation, and the second thermoelectric stage has a second surface area for thermal absorption, wherein the second surface area is greater than the first surface area. The apparatus further includes a thermal space transformer disposed between the first thermoelectric stage and the second thermoelectric stage, and thermally coupling the first thermoelectric stage to the second thermoelectric stage. The thermal space transformer has a diamond coating on a first main surface thereof, the first main surface being thermally coupled to the first surface area of the first thermoelectric stage. The diamond coating has a high thermal conductivity in a plane transverse to a direction of primary heat flow through the first thermoelectric stage and the second thermoelectric stage.

In a further aspect, apparatus for cooling an electronic device is provided which includes a first thermoelectric stage thermally coupled to the electronic device and a second thermoelectric stage. The first thermoelectric stage has a first surface area for thermal dissipation, and the second thermoelectric stage has a second surface area for thermal absorption, wherein the second surface area is greater than the first surface area. A thermal space transformer is provided and disposed between the first thermoelectric stage and the second thermoelectric stage to thermally couple the first thermoelectric stage to the second thermoelectric stage. The thermal space transformer has a first thermal conductivity in a (x-y axis) plane transverse to a direction of primary heat flow through the first thermoelectric stage and the second thermoelectric stage, and a second thermal conductivity in a (z-axis) direction parallel to the direction of primary heat flow through the first thermoelectric stage and the second thermoelectric stage. The first thermal conductivity is greater than the second thermal conductivity. The apparatus further includes a cold plate thermally coupled to the second thermoelectric stage, and a dc power controller electrically coupled to the first thermoelectric stage and the second thermoelectric stage for controlling the flow of dc power therethrough.

To restate, provided herein is a cascaded thermoelectric cooling assembly with a thermal space transformer interposed between adjacent thermoelectric stages for improved thermal performance. The thermal space transformer provides enhanced spreading of heat being "electronically pumped" from the heat load by a first thermoelectric stage, along with the heat dissipated by the thermoelectric elements of the first stage. This spreading of heat takes place in the plane of the thermal space transformer principally in a direction radially outward from the center of the first stage thermoelectric assembly, i.e., in a direction transverse to the principle heat flow through the first thermoelectric stage. Increased thermal spreading makes it possible to utilize a larger surface area for the second stage encompassing an increased number of thermoelectric couples or elements in the second stage, thereby reducing the amount of heat to be "electronically pumped" by each element. The combined effect of the first and second stage thermoelectric assemblies with the thermal space transformer in between is to accommodate an increased heat load to be pumped from the electronic module while maintaining the same temperature difference from the base of the first stage (i.e., Tcold) to the top of the second stage (i.e., Thot), or to allow a greater temperature difference between the two stages for the same heat load (i.e., lower Tcold).

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Generally stated, provided herein is a multi-stage thermoelectric cooling assembly for an electronic device, such as an electronic module. The multi-stage thermoelectric cooling assembly employs at least two cascaded thermoelectric stages with a light-weight "thermal space transformer" disposed therebetween to efficiently distribute heat from a first stage to a second stage. The multi-stage thermoelectric cooling assembly can be attached to any heat source, such as an electronics module, for the purpose of facilitating heat removal and for maintaining device temperatures below an ambient temperature.

In the context of this invention, "cascaded" thermoelectric stages means that two adjacent stages of a multi-stage thermoelectric cooling assembly have different heat dissipation and heat absorption surface areas. Further, a "thermal space transformer" is a structure disposed between two adjacent cascaded thermoelectric stages which facilitates the spreading of heat dissipated from a first stage for more efficient absorption by the second stage, having the larger surface area. Further, the relative size of surface areas of adjacent cascaded thermoelectric stages can be translated into a difference in the number of thermoelectric elements in each of the adjacent stages.

Figure 1:
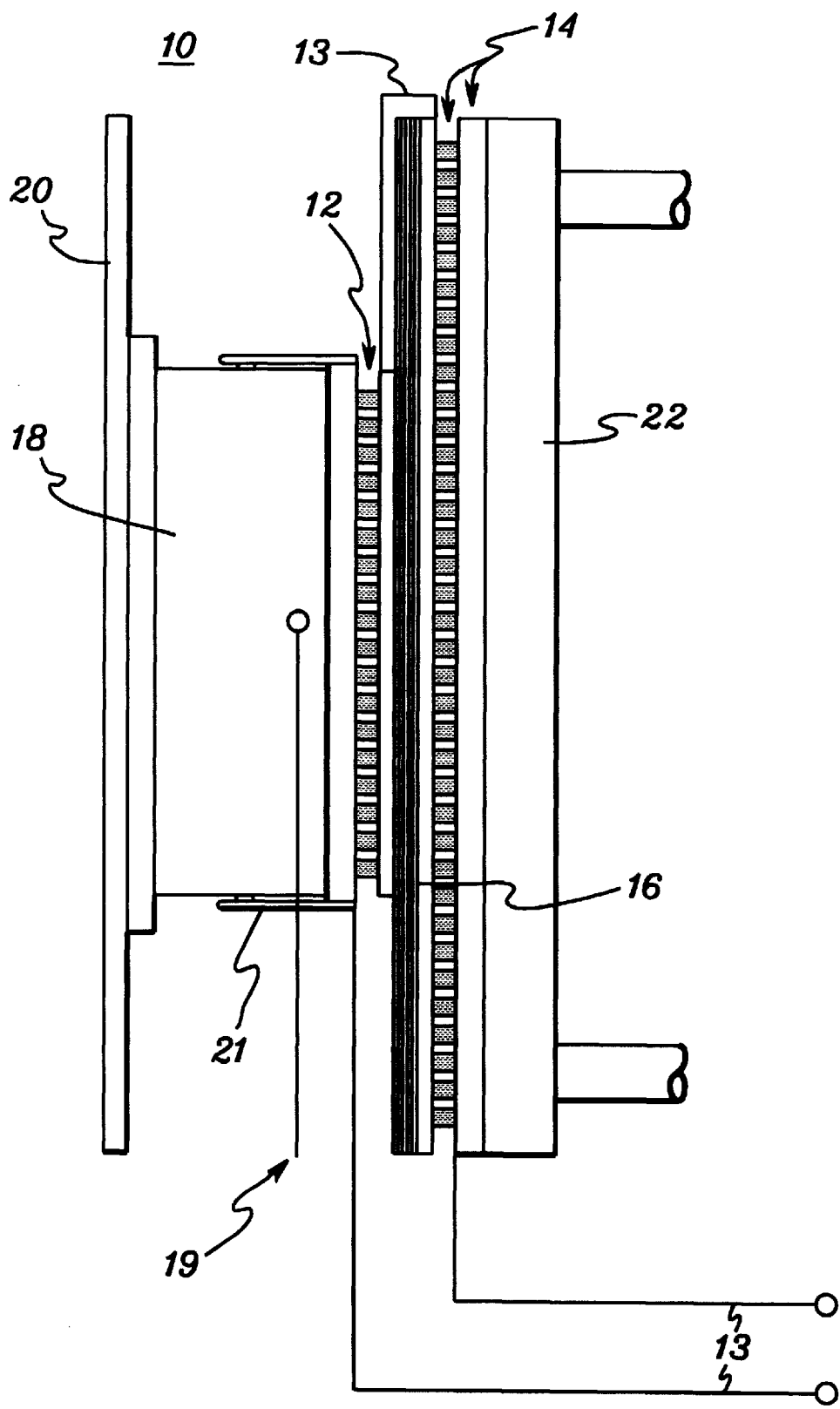
FIG. 1 is an elevational view illustrating one embodiment of an electronic device and thermoelectric cooling assembly in accordance with the principles of the present invention.

FIG. 1 depicts one embodiment of a thermoelectric cooling apparatus and electric device assembly, generally denoted 10, in accordance with the principles of the present invention. The cooling apparatus of assembly 10 includes a first stage 12 of thermoelectric elements or couples and a second stage 14 of thermoelectric elements or couples. As noted above, it is well known that by passing direct current through a series of thermoelectric couples, one side of the thermoelectric will transfer heat to the other side. Essentially, heat is "electronically" pumped from the cold side to the hot side. In the embodiment of FIG. 1, the cold side of the cooling assembly is attached to an upper surface of an electronics module 18 (for example, by a fastening mechanism such as a "cam lock" or similar fastening device 21), which is shown mounted to a printed circuit board 20 by way of example.

Heat which flows out the hot side of a set of thermoelectric couples will be comprised of the active heat pumped, in addition to the power dissipation of the thermoelectric couples in performing the "electronic heat pumping" action. The second stage 14 of electronic elements is provided to handle this total heat load. The temperature difference across the two thermoelectric stages 12, 14 will be additive. To provide adequate heat-pumping capability and to maintain a temperature difference across the second stage, the number of thermoelectric elements for the second stage is preferably greater and occupies a larger surface area than the surface area occupied by the first stage. DC power is provided to the thermoelectric couples via power lines 13.

In this example, heat flows through the first thermoelectric stage 12 to the second thermoelectric stage 14 and thereafter to a cold plate 22. Heat is therefore dissipated through a first main surface of thermoelectric stage 12 and absorbed by a first main surface of the thermoelectric stage 14 for transfer to cold plate 22. As used herein the "first main surface" of first thermoelectric stage 12 and the "first main surface" of second thermoelectric stage 14 comprise the surface areas of the respective stages which are in spaced opposing relation. In accordance with the principles of the present invention, thermal space transformer plate 16 is disposed between these opposed surfaces of the cascaded multi-stage thermoelectric cooling assembly.

As noted above, thermal space transformer 16 is provided to spread heat leaving the first stage 12 thermoelectric elements and to reduce the heat flux entering the second stage 14 thermoelectric elements. The thermal space transformer is placed between the first and second stages, with the hot side of the first stage on one side of the transformer and the cold side of the second stage on the opposite side of the transformer. To provide a low weight transformer, with high thermal conductivity parallel to the mounting planes of the thermoelectric elements, a graphite composition material 30 (FIG. 2) may be used.

Figure 2:
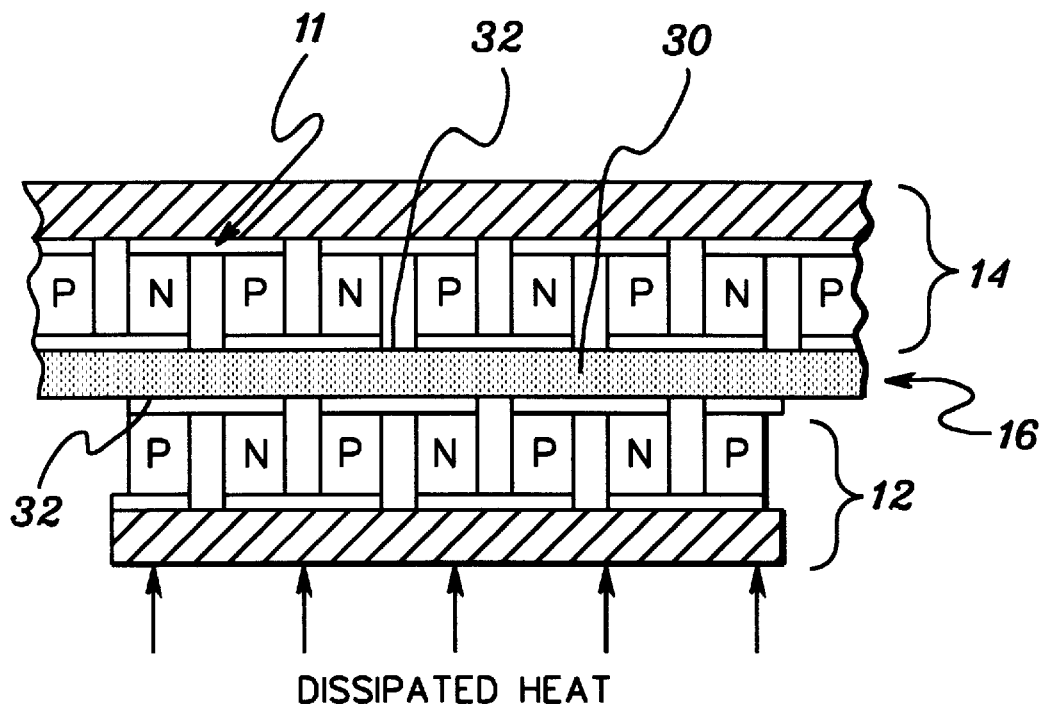
FIG. 2 is a partial cross-sectional view of the thermoelectric cooling assembly of FIG. 1 showing in greater detail a first thermoelectric stage, second thermoelectric stage and thermal space transformer in accordance with the principles of the present invention.

In the transformer 16 embodiment of FIG. 2, graphite composite material 30 is coated with a carbon vapor deposited (CVD) diamond coating 32 on each main surface. Diamond coating 32 has a high thermal conductivity and ensures electrical isolation of lands 11 interconnecting the n and p thermoelectric couples or elements. Dissipated heat is transferred from the electronic device (not shown in FIG. 2) in the direction of the arrows through the first stage thermoelectric elements 12, the thermal space transformer 16, to the second stage thermoelectric elements 14. As shown in FIG. 2, the diamond coating on each main surface of the thermal space transformer 16 is clad with a pattern of lands 11 on both faces. The first and second stage thermoelectric elements are metallurgically bonded to lands 11 providing low thermal resistance joints. The lands, which may comprise cooper, also provide the necessary electrical interconnections between adjacent n and p type thermoelectric elements on each side of thermal space transformer 16.

In one specific embodiment, a thermal space transformer 16 such as presented herein can comprise a graphite composition such as marketed by AMOCO of Alpharetta, Ga. as a ThermalGraph® 8000 panel (ThermalGraph® is a registered trademark of AMOCO).

Figure 3:
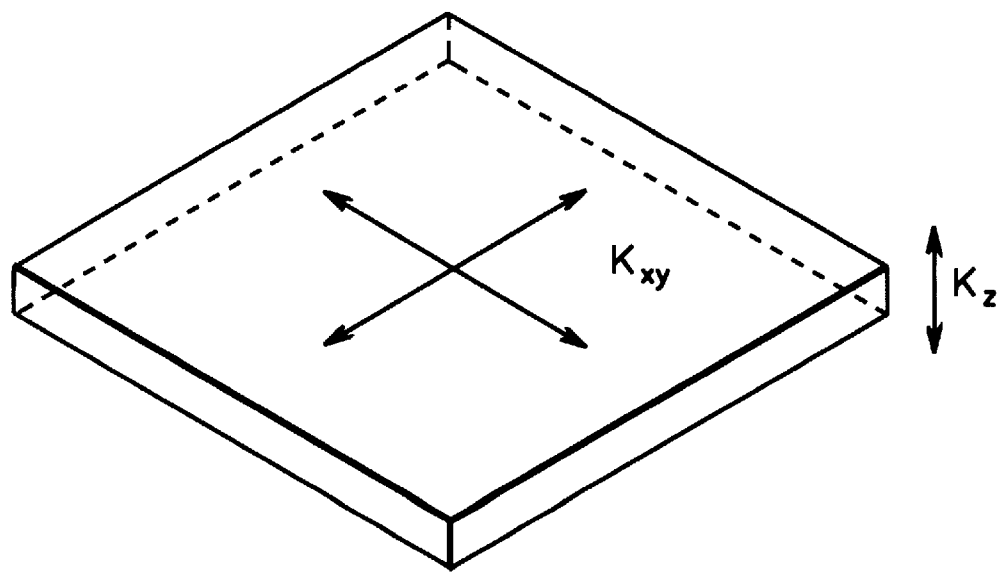
FIG. 3 is a perspective view of a thermal space transformer implemented in accordance with the principles of the present invention showing an x-y axis thermal conductivity ($K_{xy}$) and z-axis thermal conductivity ($K_z$)

One embodiment of thermal space transformer 16 is depicted in FIG. 3. As shown, transformer 16 has two planar main surfaces, which for purposes of this application are each deemed to extend in a planar x-y axis direction. Transformer 16 also has a thickness extending in the z-axis plane. When disposed within a thermoelectric cooling assembly in accordance with this invention, the planar main (x-y axis) surfaces are transverse to a direction of heat flow between the thermal couples of the first stage and the second stage, and are thereby substantially parallel to the first surface area of the first stage and the first surface area of the second stage. The thickness of transformer 16 extends in the z-axis direction and is parallel to the direction of heat flow between the first stage and the second stage of the thermoelectric cooling assembly.

In accordance with one aspect of the present invention, thermal conductivity of transformer 16 in the x-y axis direction ($K_{xy}$) is preferably greater than thermal conductivity of the transformer in the z-axis direction ($K_z$). This allows heat dissipated from the first stage to more readily spread out through the transformer to all thermoelectric elements of the second stage. For example, thermal conductivity $K_{xy}$ in the x-y axis plane may be in the range of 400–800 Watts/meter Kelvin (W/mK), while thermal conductivity $K_z$ in the z-axis direction may be less than 100 W/mK. As a more specific example, the graphite composite ThermalGraph® 8000 panel referenced above can have a thermal conductivity Kxy in the range of 650–800 W/mK, and a thermal conductivity $K_z$ of 20–30 W/mK.

Note that although a thermoelectric cooling assembly in accordance with the principles of the present invention is described herein in the context of a two-stage thermoelectric cooling assembly, with a single thermal space transformer, the concepts presented herein can be readily extended to multi-stage assemblies having more than two stages. In such a case, multiple thermal space transformers would be employed, with each thermal space transformer being disposed between a different pair of adjacent, cascaded thermoelectric stages.

Figure 4:
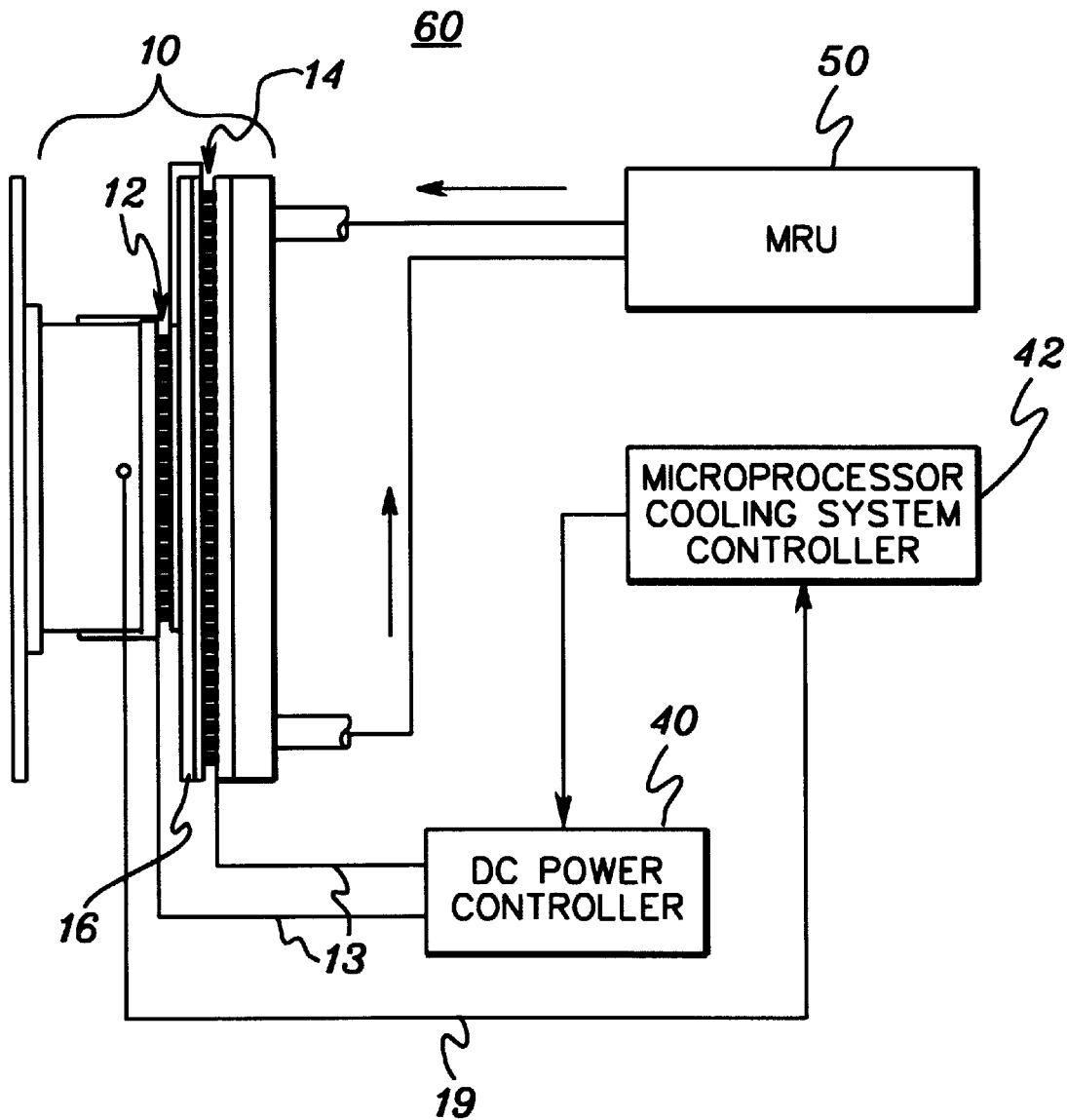
FIG. 4 is a schematic of one embodiment of an electronic device, cascaded thermoelectric cooling assembly and refrigeration unit in accordance with another aspect of the present invention.

As shown in FIG. 4, the hot side of the second stage 14 of thermoelectric couples can be cooled by a cold plate 22. The cold plate may utilize a single-phase coolant (e.g., water), or an evaporative refrigerant to achieve even lower temperatures. FIG. 4 depicts a simplified schematic of a cooling system, generally denoted 60, employing the thermoelectric cooling assembly of FIGS. 1 & 2. In this instance, an evaporative cold plate 22 is utilized and heat is rejected to the environment via a modular refrigeration unit (MRU) 50. A microprocessor cooling system controller 42 monitors the electronic module temperature via a thermistor, for example, mounted within the module housing. A thermistor sense line 19 is fed back to the cooling system controller 42. If the module temperature changes, controller 42 can provide a signal to a dc power controller 40 to increase or decrease electric current to the thermoelectric cooling assembly as required to quickly return the heat source to a set point condition or range.

Figure 5:
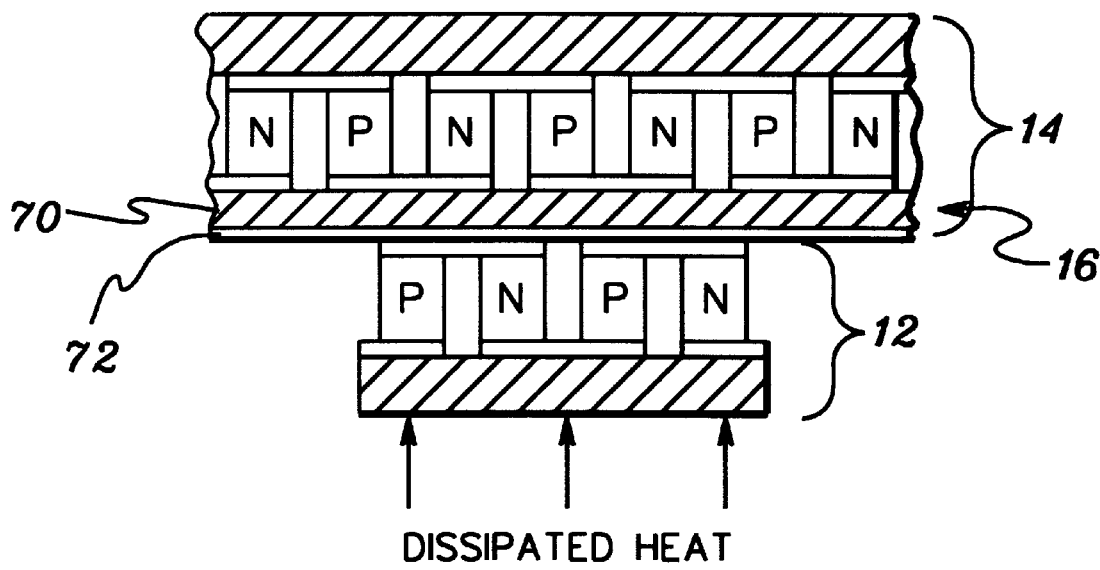
FIG. 5 is a partial cross-sectional view of another embodiment of a cascaded thermoelectric cooling assembly in accordance with the principles of the present invention.

FIG. 5 depicts an alternate embodiment of a thermal space transformer 16 in accordance with the principles of the present invention. Transformer 16 again thermally couples a first stage 12 of thermoelectric elements and a second stage 14 of thermoelectric elements. First thermoelectric stage 12 and second thermoelectric stage 14 comprise cascaded thermoelectric stages wherein a surface area of the second thermoelectric stage is greater than a surface area of the first thermoelectric stage. Thermal space transformer 16 again functions to spread heat dissipated from the first thermoelectric stage to the full extent of the second thermoelectric stage. To accomplish this, the thermal conductivity ($K_{xy}$) in the x-y axis plane of the transformer is preferably greater than the thermal conductivity ($K_z$) in the z-axis direction (see FIG. 3).

More particularly, in the embodiment of FIG. 5, the thermal space transformer 16 comprises a laminate structure which includes a dielectric substrate 70 and a carbon vapor deposited (CVD) diamond coating 72. The CVD diamond coating can be a relatively thick layer, for example, 0.5 mm –0.75 mm of diamond on a suitable dielectric substrate. The dielectric substrate may have a thickness of 1.25 mm to 1.5 mm, and may comprise by way of example alumina. In order for the thermal space transformer to properly function, the CVD diamond coating should be in contact with the first stage thermoelectric elements 12 and the dielectric should be in contact with the second stage thermoelectric elements 14.

Those skilled in the art will note from the above disclosure that a thermal space transformer is described herein which enhances spreading of heat being "electronically pumped" from a heat load by a cascaded multi-stage thermoelectric assembly. The spreading of heat takes place in the plane of the thermal space transformer principally in a direction radially outward from the center of the first stage thermoelectric assembly. Increased thermal spreading makes it possible to utilize a larger surface area for the second stage thermoelectric assembly, thereby encompassing an increased number of thermoelectric couples in the second stage and reducing the amount of heat to be "electronically pumped" by each element. The combined effect of the first and second stage thermoelectric assemblies with the thermal space transformer disposed therebetween is to accommodate an increased heat load to be pumped from the heat source, while maintaining the same temperature difference from the base of the first stage (i.e., Tcold) to the top of the second stage (i.e., Thot), or to allow a greater temperature difference between the two stages for the same heat load (i.e., a lower Tcold).

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. Apparatus for cooling an electronic device, said apparatus comprising:
    a first thermoelectric stage thermally coupled to said electronic device, said first thermoelectric stage having a first surface area for thermal dissipation;
    a second thermoelectric stage, said second thermoelectric stage having a second surface area for thermal absorption, wherein said second surface area is greater than said first surface area; and
    a thermal space transformer disposed between said first thermoelectric stage and said second thermoelectric stage, and thermally coupling said first thermoelectric stage to said second thermoelectric stage, wherein said thermal space transformer has a first thermal conductivity in an x-y axis plane transverse to a direction of primary heat flow through said first thermoelectric stage and said second thermoelectric stage, and a second thermal conductivity in a z axis direction parallel to said direction of primary heat flow through said first thermoelectric stage and said second thermoelectric stage, and wherein said first thermal conductivity is greater than said second thermal conductivity.

2. The apparatus of claim 1, wherein said thermal space transformer comprises a composite material.

3. The apparatus of claim 2, wherein said composite material comprises a graphite composite material, and wherein said first thermal conductivity is in a range of 400–800 Watts/meter Kelvin.

4. The apparatus of claim 3, wherein said thermal space transformer further comprises a dielectric coating on a first main surface and a second main surface of said thermal space transformer.

5. The apparatus of claim 4, wherein said dielectric coating comprises a carbon vapor deposited (CVD) diamond coating on said first main surface and said second main surface, said diamond coating having a high thermal conductivity.

6. The apparatus of claim 1, further comprising a cold plate, said cold plate being thermally coupled to said second thermoelectric stage.

7. The apparatus of claim 6, wherein said cold plate is cooled by a refrigeration unit.

8. The apparatus of claim 1, wherein said x-y axis plane transverse to said direction of primary heat flow is parallel to said first surface area of said first thermoelectric stage and parallel to said second surface area of said second thermoelectric stage.

9. The apparatus of claim 1, wherein said electronic device comprises an electronic module, and wherein said apparatus further comprises a dc power controller coupled to said first thermoelectric stage and said second thermoelectric stage for controlling power therethrough, and wherein a temperature sensor is thermally coupled to said electronic module and said apparatus further comprises a cooling system controller coupled to said temperature sensor and to said dc power controller for monitoring and controlling temperature of said electronic module through adjustments to dc power supplied to said first thermoelectric stage and said second thermoelectric stage.

10. The apparatus of claim 1, wherein said thermal space transformer comprises a multi-component laminate, said multi-component laminate including a dielectric substrate.

11. The apparatus of claim 10, wherein said multi-component laminate further includes a carbon vapor deposited (CVD) diamond layer on said dielectric substrate.

12. The apparatus of claim 11, wherein said dielectric substrate comprises alumina.

13. The apparatus of claim 11, wherein said CVD diamond layer is thermally coupled to said first surface area of said first thermoelectric stage, and wherein said dielectric substrate is thermally coupled to said second surface area of said second thermoelectric stage.

14. Apparatus for cooling a heat source, said apparatus comprising:
    a first thermoelectric stage thermally coupled to said heat source, said first thermoelectric stage having a first surface area for thermal dissipation;
    a second thermoelectric stage, said second thermoelectric stage having a second surface area for thermal absorption, wherein said second surface area is greater than said first surface area; and
    a thermal space transformer disposed between said first thermoelectric stage and said second thermoelectric stage, and thermally coupling said first thermoelectric stage to said second thermoelectric stage, wherein said thermal space transformer has a diamond coating on a first main surface thereof, said first main surface being thermally coupled to said first surface area of said first thermoelectric stage, said diamond coating having a high thermal conductivity in a plane transverse to a direction of primary heat flow through said first thermoelectric stage and said second thermoelectric stage.

15. The apparatus of claim 14, wherein said thermal space transformer further comprises a graphite composite material, and wherein said diamond coating is disposed on both said first main surface of said thermal space transformer and a second main surface of said thermal space transformer with said graphite composite material disposed therebetween.

16. The apparatus of claim 14, wherein said thermal space transformer further comprises a dielectric substrate, said diamond coating being disposed on said dielectric substrate.

17. The apparatus of claim 16, wherein said dielectric substrate comprises alumina.

18. The apparatus of claim 16, wherein said dielectric substrate has a main surface thermally coupled to said second surface area of said second thermoelectric stage for transferring heat thereto from said first thermoelectric stage.

19. Apparatus for cooling a heat source, said apparatus comprising:
    a first thermoelectric stage thermally coupled to said heat source, said first thermoelectric stage having a first surface area for thermal dissipation;
    a second thermoelectric stage, said second thermoelectric stage having a second surface area for thermal absorption, wherein said second surface area is greater than said first surface area; and
    a thermal space transformer disposed between said first thermoelectric stage and said second thermoelectric stage, and thermally coupling said first thermoelectric stage to said second thermoelectric stage, wherein said thermal space transformer comprises a graphite composite material having a thermal conductivity greater than 400 watts/meter Kelvin in a plane transverse to a direction of primary heat flow through said first thermoelectric stage and second thermoelectric stage.

20. Apparatus for cooling an electronic device, said apparatus comprising:

a first thermoelectric stage thermally coupled to said electronic device, said first thermoelectric stage having a first surface area for thermal dissipation;

a second thermoelectric stage, said second thermoelectric stage having a second surface area for thermal absorption, wherein said second surface area is greater than said first surface area;

a thermal space transformer disposed between said first thermoelectric stage and said second thermoelectric stage, and thermally coupling said first thermoelectric stage to said second thermoelectric stage, wherein said thermal space transformer has a first thermal conductivity in an x-y axis plane transverse to a direction of primary heat flow through said first thermoelectric stage and said second thermoelectric stage, and a second thermal conductivity in a z axis direction parallel to said direction of primary heat flow through said first thermoelectric stage and said second thermoelectric stage, and wherein said first thermal conductivity is greater than said second thermal conductivity;

a cold plate thermally coupled to said second thermoelectric stage; and a dc power controller electrically coupled to said first thermoelectric stage and to said second thermoelectric stage for controlling the flow of dc power therethrough.

21. The apparatus of claim 20, wherein said cold plate is cooled by a refrigeration unit, and wherein said dc power controller receives feedback representative of a temperature of said electronic device for maintaining said temperature within a desired range.

* * * * *